Figure 1A:
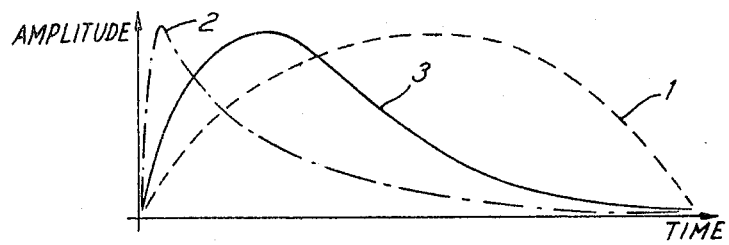

United States Patent [19]

Hounsfield

[11] 4,424,488

[45] Jan. 3, 1984

[54] NUCLEAR MAGNETIC RESONANCE APPARATUS

[75] Inventor: Godfrey N. Hounsfield, Newark, England

[73] Assignee: Picker International Limited, Wembley, England

[21] Appl. No.: 265,165

[22] Filed: May 19, 1981

[30] Foreign Application Priority Data

May 21, 1980 [GB] United Kingdom ............... 8016808

[51] Int. Cl.³ .......................................... G01R 33/08
[52] U.S. Cl. ................................. 324/309; 324/307
[58] Field of Search ...................... 324/300, 309, 307

[56] References Cited

U.S. PATENT DOCUMENTS

| 4,021,726 | 5/1977 | Garroway | 324/309 |
| 4,307,343 | 12/1981 | Likes | 324/309 |
| 4,355,282 | 10/1982 | Young | 324/309 |

FOREIGN PATENT DOCUMENTS

| 1471531 | 4/1973 | United Kingdom . |
| 1584948 | 2/1978 | United Kingdom . |
| 1578910 | 5/1978 | United Kingdom . |
| 1584949 | 5/1978 | United Kingdom . |
| 1584950 | 5/1978 | United Kingdom . |

Primary Examiner—Michael J. Tokar
Attorney, Agent, or Firm—Fleit, Jacobson, Cohn & Price

[57] ABSTRACT

In Nuclear Magnetic Resonance (NMR) imaging systems it is known to excite resonance in a slice of a body and to sample the resonance signals in the presence of a field gradient across the slice. The gradient field is pulsed. Where such systems analyse the signal to be for many sets of strips in the slice, each set in a different direction, for analysis by techniques used in computerized tomography (CT) X-ray systems, it is now proposed that the field gradient pulsed should reach a maximum after not more than one third of its total duration to balance the spatial frequency emphasis (FIG. 1e) in the CT processing.

7 Claims, 4 Drawing Figures

NUCLEAR MAGNETIC RESONANCE APPARATUS

The present invention relates to systems for investigating the distribution of a quantity, in a chosen region of a body, by nuclear magnetic resonance (NMR) techniques.

Nuclear magnetic resonance is known for the analysis of materials, particularly by spectroscopy. It has been suggested that the techniques be applied to medical examination to provide distributions of density of chosen nuclei, for example protons, or of relaxation time constants in sectional slices or volumes of patients. Such distributions are similar to, although of different significance from, the distributions of x-ray attenuation provided by computerised tomography (CT) systems.

Practical NMR apparatus operate by applying suitable combinations of magnetic fields to the body being examined, via magnet (coil) systems, and detecting induced current in one or more detector coil systems. A suitable sequence of pulsed magnetic fields and apparatus to operate that sequence have been devised and, together with other improvements, are described and claimed in our U.S. Pat. Nos. 4,254,778, 4,315,216, 4,284,948, 4,300,096, and 4,284,950, and our U.K. Pat. No. 1,603,560.

In that arrangement a basic steady magnetic field is applied in a direction usually parallel to the axis of the patient's body. Other magnetic fields are then applied to cause resonance in a chosen cross-sectional slice of the patient. The resonance signal from the slice can then be detected. As it is detected there is applied a further field having a gradient in a chosen direction in the plane of the slice. This causes dispersion of the resonance frequencies in that direction and consequent phase dispersion in the resonance signal detected. Frequency analysis of this signal, generally by Fourier Transformation, yields a plurality of resonance signals each for a different one of a plurality of strips perpendicular to the direction of the gradient. For analysis by CT techniques known for x-rays this procedure is repeated for many different directions of the gradient to provide a plurality of sets of signals for sets of strips in different directions.

In a practical system this gradient pulse is not applied as a square pulse but is of another shape, such as a distorted sinusoid, to suit practical considerations.

In our U.S. Pat. No. 4,315,216 it is disclosed that, in such systems using field gradients during detection, it is desirable to sample the resonance signal at intervals such that the gradient field integral, and therefore the change of phase of the resonance signals, is equal for each such interval. Such sampling is at unequal intervals of time and for that reason the technique has been identified as "non-linear" or "stretch-time" sampling. In U.K. Pat. No. 1584949 there are disclosed arrangements for achieving sampling at the correct intervals and alternatives are disclosed and claimed in the U.S. patent application Ser. No. 265,152, filed May 19, 1981.

It is an object of this invention to provide an NMR imaging arrangement having improved noise performance.

According to the present invention there is provided a method of operating a NMR imaging system in which there is applied a pulsed field having a gradient in a direction lying in a cross-sectional slice of a body being examined, the nuclei in said slice having been selectively excited to resonance, and resonance signals are sensed during said pulsed field and subsequently analysed the method including the application of a pulsed gradient field for which the pulse is shaped to reach a maximum after not more than one third of the total duration of the pulse.

According to another embodiment of the invention there is provided an NMR apparatus operating the method of the preceding paragraph.

Figure 1B:
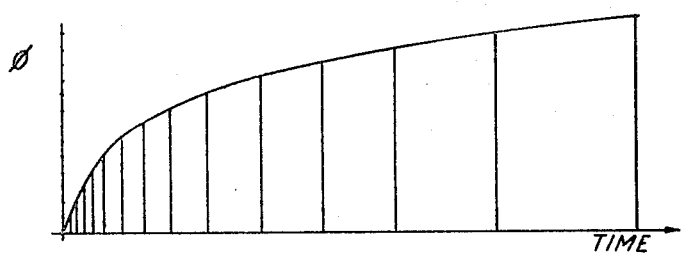
Figure 1C:
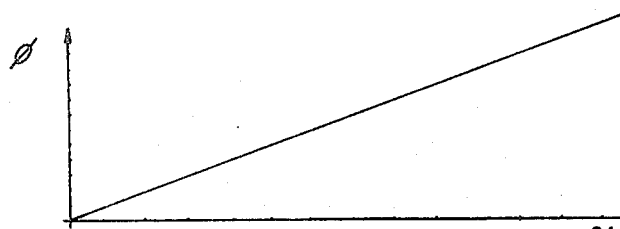
Figure 1D:
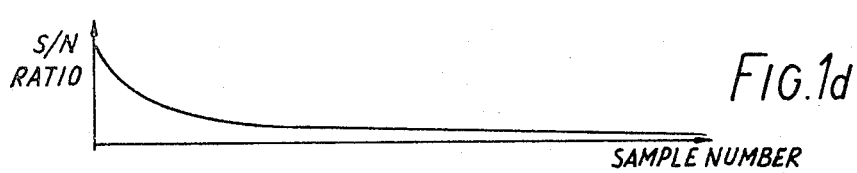
Figure 1E:
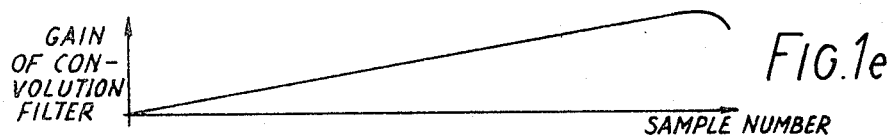
Figure 1F:
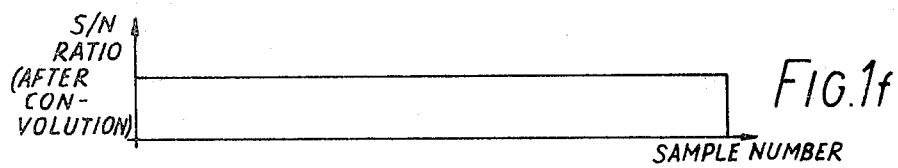
Figure 2:
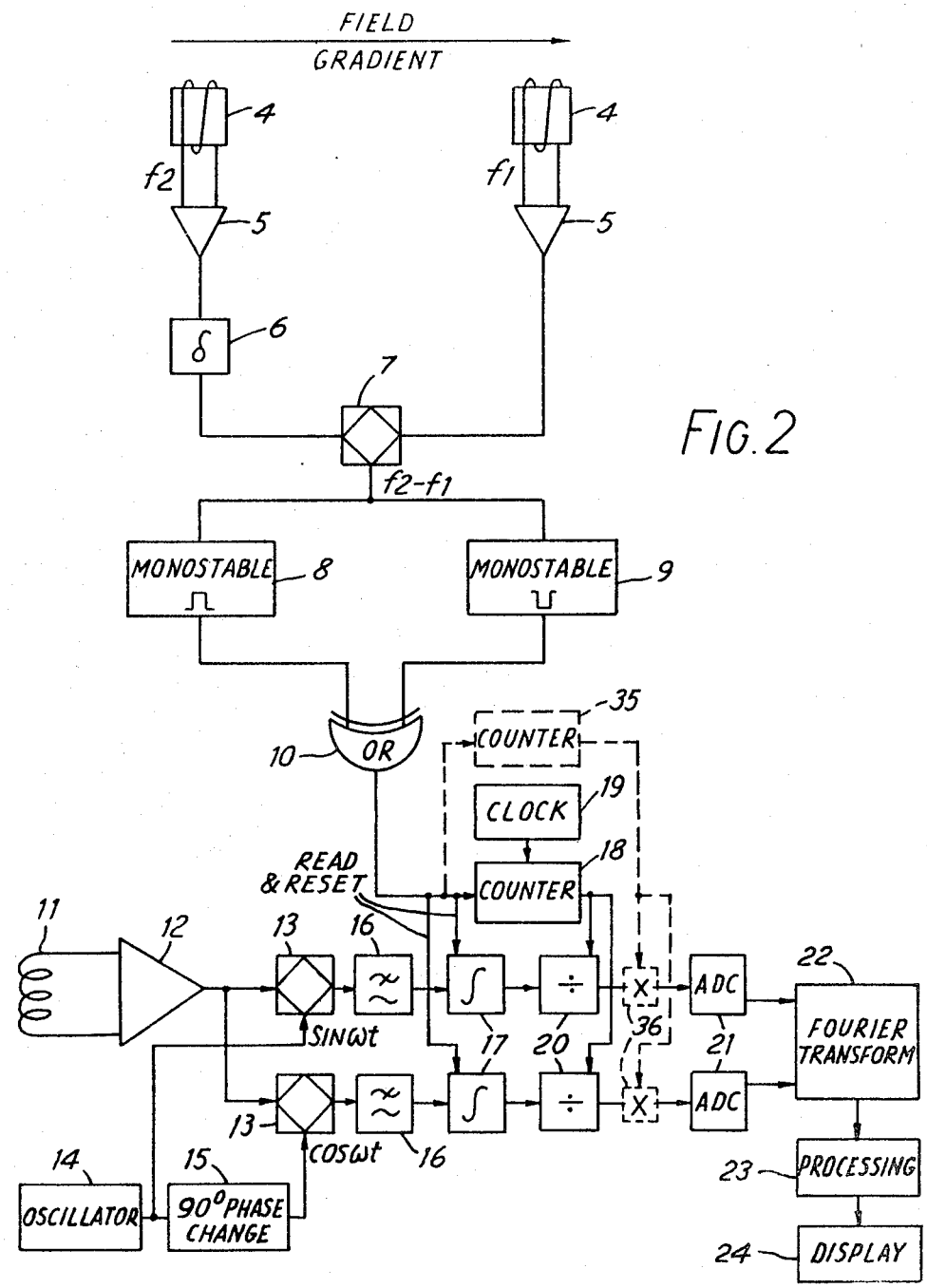
Figure 3:
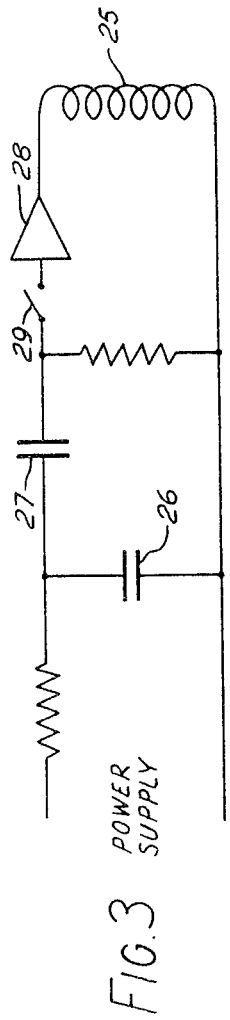
Figure 4:
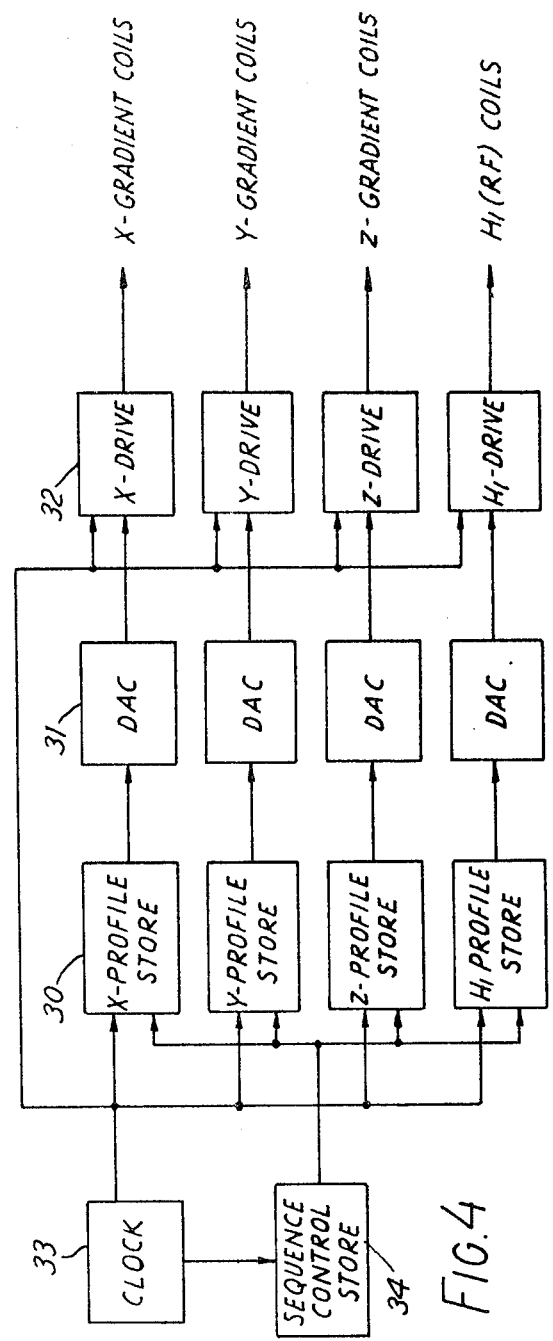

In order that the invention may be clearly understood and readily carried into effect it will now be described, by way of example, with reference to the accompanying drawings, of which, FIG. 1 explains the significance of different pulse shapes applied to the gradient field coils in relation to sampling and signal to noise ratio, FIG. 2 shows the sampling and signal handling part of the NMR system, FIG. 3 shows one arrangement for generating the field gradient pulse and FIG. 4 shows an alternative arrangement for generating the field gradient and other pulses.

Considering systems of the type discussed hereinbefore, in which NMR signals are measured during the application of a gradient and the signals subsequently Fourier Transformed to provide distinct signals for parallel strips perpendicular to the direction of the gradient (equivalent to the "edge readings" of x-ray CT systems). It is known that the subsequent convolution may be achieved by passing the signal after the Fourier transform through a suitable filter which attenuates the lower frequencies. It has been recognised that the NMR signals measured at the start of the gradient pulse contribute to the low spatial frequencies of the strip signals after Fourier transformation while those following contribute to the successively higher spatial frequencies of the strip signals. The same convolution as above therefore can be achieved before Fourier transform by increasing the gain of the signal progressively with time. However both methods are not ideal as the lower frequencies being attenuated would be less "noisy" and the higher frequencies would contain more noise. The invention provides a means of varying the sampling interval with time such that the higher frequencies after transform (which are sampled later) are more widely spaced and therefore less "noisy" than the lower frequencies which are sampled at relatively narrowly spaced intervals. This compensates for the above problem which causes the reverse noise spectrum.

The present invention, by pre-emphasizing the lower spatial frequencies thus balances the effects of such convolution processing so that at least the low and high spatial frequencies are, after Fourier Transform and the convolution, given substantially the same emphasis.

Emphasis of the low spatial frequencies is achieved by increasing the amplitude of the gradient field initially and allowing it to decrease with time. It will be appreciated that due allowance must be made for the effects which this increased amplitude has on the phase dispersion and such allowance is made possible by the non-linear sampling procedure of U.K. Pat. No. 1584949. That is to say, the amplitude of the gradient field may be increased as long as the sampling interval is reduced to maintain the field integral between samples substantially constant.

In FIG. 1a there are shown alternative shapes of the field gradient pulse. The broken curve 1 shows one known pulse shape for this gradient, which is as mentioned a distorted sinusoid. Other substantially symmetrical shapes have been proposed. The chain dotted curve 2 shows the pulse shape which would be preferred for this invention. Considering the non-linear sampling procedure, in which the aim is to sample at equal intervals of field integral, it will be seen that the samples would initially be taken relatively rapidly and then at increasingly longer intervals as the pulse dies away.

FIG. 1b shows the phase change caused by pulse shape 2 plotted against time, with the required sampling intervals marked. It will be understood that samples could be taken instantaneously at each of the indicated times but it is preferred that samples be integrated over the intervals between and normalised by the elapsed time.

If the curve of FIG. 1b is replotted with the sample times uniformly spaced along the horizontal axis the straight line of FIG. 1c is obtained; this is the effect sought by the non-linear sampling. However because the integrated sampling intervals vary, the true signal is only found by dividing it by the interval width, the shorter time intervals therefore will produce more noise and the signal to noise ratio will change as in FIG. 1d. However, as discussed hereinbefore, the convolution filter has a gain characteristic as shown in FIG. 1e so that after convolution processing the signal to noise ratio is substantially constant as in FIG. 1f.

It will be appreciated that the pulse shape shown at 2 in FIG. 1a is not straightforward to produce in view of the required rapid rise in field and therefore of coil current. However the initial rapid rise can be reduced and still give an improvement. For example the solid curve 3 in FIG. 1a is more suitable in practice. It is therefore proposed that the gradient pulse should be shaped so that the peak occurs before one third of the total pulse duration has elapsed.

Arrangements for implementing non linear sampling of NMR signals during a field gradient pulse have been described in British Pat. No. 1584949 and U.S. application corresponding to British Application No. 8016807 and they may readily be adapted for the present invention. FIG. 2 shows one suitable circuit.

Sensing of the current value of the magnetic field in the apparatus can be by suitable probes which may be NMR probes. The NMR probe comprises simply a small volume of water in a suitable container with a coil wound around it. The coil picks up resonance signals excited in the doped water sample and, provided the volume of the water is sufficiently small in the relevant direction, these probes can have adequate resolution in that direction.

In FIG. 2, two NMR probes 4 are shown schematically. The probe outputs are amplified in amplifiers 5 and one is put through a variable delay 6. This is not essential but serves to provide adjustment of the relative starting phase of the two probes. The probes can be demodulated against a master oscillator but in this example they have been spaced so that they are on opposing sides of the body being examined and, provided they are sufficiently small that they do not have more than about $\pi$ phase change across their lengths, they can be used to demodulate each other.

For one such probe pair displaced in the direction of the field gradient the probe outputs start in phase as the gradient is applied and there is a continuing change in the relative phase of the outputs during the gradient pulse. The two outputs at frequencies $f_1$ and $f_2$ are then applied to a demodulator 7 which gives a sinusoidal output at the difference frequency $(f_2-f_1)$. Although it is not essential, a convenient way of achieving equal intervals of phase change is to sample at the zero-crossings of the difference signal and so that signal is applied to two monostable circuits 8 and 9, which are triggered by rising and falling voltages respectively. The monostable outputs become inputs to an exclusive OR gate 10 which then provides an output pulse at each zero-crossing of the difference frequency $(f_2-f_1)$. Each output pulse is used to initiate a sample of the NMR signal from the detector coils of the main apparatus as described in said co-pending applications.

FIG. 2 also includes the signal handling circuits for the NMR apparatus. The main signal sensing coils are shown at 11, the position in the drawing relative to probes 4 not being representative of an actual apparatus. The coils 11 supply through a head amplifier 12, the NMR signals detected during the pulsed field gradient and the signals are applied to demodulators 13. Since phase information is generally required, these demodulators use sine and cosine signals from a master oscillator 14 and a 90° phase shift circuit 15 to provide in-phase and quadrature components. After low pass filtering 16 the signals are supplied to circuits 17 where they are sampled in response to the sampling signals derived from probes 4.

The circuit described so far is essentially as in the Patent Application corresponding to British Application No. 8016807. In this example the NMR signals are integrated over the intervals between sampling times. Circuits 17 therefore are integrating circuits for which the signals derived from probes 4 act as read and reset signals. The intervals between resetting being variable, if the sampling is by integration rather than instantaneous sampling, the sampled signals must be normalised by the integration period. For this purpose a counter 18 counts pulses from a clock 19 between each sampling pulse and the integrated signals from 17 are divided by the count for the respective integration period in dividing circuits 20. The samples are then digitised in analogue to digital converters 21 and Fourier Transformed in circuits 22 for a CT (convolution) type of processing at 23 and display (or storage) at 24. The circuit addition shown in broken line, including counter 35 and multiplier 36 provides the alternative method of achieving correlation referred to hereinbefore. This involves increasing the channel gain with increasing sample number.

The magnetic fields may be generated by field coils which are rotated around the patient's body to achieve the required changes in the gradient direction. In that case probes 4 can be rotated with those coils. In another embodiment orthogonal x and y field coils are provided (where x and y are orthogonal axes in the plane of the slice) and the direction of the resultant field gradient is changed by varying the x and y components. In that case two pairs of probes 4, orthogonally disposed, may be provided and the output used from that pair which is displaced in a direction closest to the direction of the gradient.

Turning now to the creation of the field gradient pulse shown in FIG. 1a, this task is simplified since the shape is not affected by the inductance of the gradient field coils, as a current amplifier separates the shaping circuit from the coils. The pulse can therefore be generated by discharging a capacitor with another capacitor in series with the load to provide the appropriate time constant.

A circuit is shown in schematic form in FIG. 3. The field coils 25 take any suitable form such as those described in said Patents and co-pending applications. A capacitor 26 has a long time constant. These are discharged into coils 25 via current amplifier 28 by an electronic switch 29.

The circuit of FIG. 3 is appropriate to an arrangement in which the gradient coils are rotated around the patient's body. However for arrangements in which orthogonal coils are used it is preferable to use a more flexible arrangement. FIG. 4 shows an arrangement suitable for all coil systems, in which the pulse shape is precalculated and held in look up tables as values of coil current at different times. Although for the present purposes generation of the field gradient pulse, in orthogonal x and y components, is required, the circuit of FIG. 4 conveniently includes the generation of other pulsed fields required by the signal. In this example they are a so-called z-gradient orthogonal to the examined slice, which determines the field in the slice for resonance, and the $H_1$ (RF) field which excites resonance in the slice at the Larmor frequency for the field set prior to dispersion by the in-slice gradient.

Considering FIG. 4, four profile stores 30 hold the required shapes for the x-gradient (x), y-gradient (y), z-gradient ($G_z$) and $H_1$ pulses in terms of predetermined current amplitudes and required duration (a predetermined number of clock pulses). The specified current at any instant is converted from the digital form in which it is stored to analogue form in digital to analogue converters 31 and the current is supplied via conventional drive circuits 32 to the respective coils. Timing is by clock pulses from the system clock 33, which may be clock 19.

The operation of the four profile stores 30 is by a sequence control store 34 which stores the sequence of operation of the profile stores 30 and the duration (in numbers of clock pulses) of operation of each stage of the pulse sequence (including gaps therein). Operation of this invention is therefore by storing in the x and y profile stores 30 components of a gradient pulse shape as described hereinbefore.

Other embodiments of the invention will be apparent to those skilled in the NMR art.

As an alternative to the use of master oscillator 14 (shown in FIG. 2), demodulation may be by the signal from one of the probes 4. The zero-frequency may then be at the edge of the final picture. This technique is the subject of the U.S. Patent Application corresponding to British Patent Application No. 8016809.

What I claim is:

1. A method of operating an NMR imaging system in which there is applied a pulsed field having a gradient in a direction lying in a cross-sectional slice of a body being examined, the nuclei in said slice having been selectively excited to resonance, the resonance signal is sensed during the pulsed field, the sensed signal is sampled and the samples analysed by a method including Fourier transformation, the sampling interval being varied with time in such a way that the higher frequencies after transformation orginate from a sampling which is more widely spaced than the sampling producing the lower spatial frequencies.

2. A method according to claim 1 in which the analysis includes effective convolution of the resonance signal with a convolution function which emphasises the higher frequencies in the sensed resonance signal.

3. A method according to claim 1 in which the sensed resonance signal is sampled at intervals such that the field integral of the gradient field is substantially equal in each said interval.

4. A method according to claim 2 in which the pulse for the gradient field is shaped to reach a maximum after not more than one third of the total duration of the pulse.

5. A nuclear magnetic resonance imaging apparatus including means for selectively exciting resonance in nuclei in a cross-sectional slice of a body being examined, means for applying a pulsed field having a gradient in a direction in the slice to disperse the resonance frequencies of the nuclei in the direction of the gradient, means for sensing resonance signals emitted by the nuclei and sampling them at intervals such that the field integral of the gradient field is substantially equal in each such interval and means for processing the samples by a method including effective convolution with a convolution function which emphasises the higher frequencies in the sensed resonance signal wherein the gradient field is so shaped as to cause the higher frequencies of the processed signals to originate from resonance signals sampled at more widely spaced intervals than the lower frequencies of the processed signals.

6. A nuclear magnetic resonance imaging apparatus according to claim 13 wherein the means for applying the pulsed field is arranged to apply a pulse shaped to reach a maximum after not more than one third of the total duration of the pulse.

7. A nuclear magnetic resonance imaging apparatus according to claim 13 arranged to repeat the procedure for different directions of the said field gradient and wherein means are provided for combining the processed signals for each of said directions to provide an image of said slice.

* * * * *